United States Patent
Deng

(10) Patent No.: US 9,147,596 B2
(45) Date of Patent: Sep. 29, 2015

(54) METHOD FOR FORMING SHALLOW TRENCH ISOLATION

(71) Applicant: Semiconductor Manufacturing International (Shanghai) Corporation, Shanghai (CN)

(72) Inventor: Hao Deng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/040,605

(22) Filed: Sep. 27, 2013

(65) Prior Publication Data

US 2015/0004773 A1    Jan. 1, 2015

(51) Int. Cl.
*H01L 21/76*    (2006.01)
*H01L 21/762*    (2006.01)

(52) U.S. Cl.
CPC ................................. *H01L 21/76224* (2013.01)

(58) Field of Classification Search
CPC ............ H01L 21/02222; H01L 21/316; H01L 21/02315
USPC ......................................... 438/425, 798, 434
See application file for complete search history.

(56) References Cited

U.S. PATENT DOCUMENTS

| | | | |
|---|---|---|---|
| 6,287,939 B1 * | 9/2001 | Huang et al. ................... | 438/435 |
| 6,362,035 B1 * | 3/2002 | Shih et al. ...................... | 438/199 |
| 7,071,107 B2 * | 7/2006 | Hieda et al. .................... | 438/691 |
| 2003/0164519 A1 * | 9/2003 | Sugihara ........................ | 257/344 |
| 2004/0048452 A1 * | 3/2004 | Sugawara et al. .............. | 438/484 |
| 2005/0136686 A1 * | 6/2005 | Kim et al. ...................... | 438/778 |
| 2007/0049046 A1 * | 3/2007 | Sawada et al. ................. | 438/758 |
| 2010/0143609 A1 * | 6/2010 | Fukazawa et al. ............. | 427/585 |
| 2014/0209562 A1 * | 7/2014 | LaVoie et al. ...................... | 216/2 |

* cited by examiner

*Primary Examiner* — Caridad Everhart
(74) *Attorney, Agent, or Firm* — Kilpatrick Townsend and Stockton LLP

(57) ABSTRACT

A method for forming shallow trench isolation (STI) structures includes using a hard mask, such as silicon nitride, in shallow trench etching and also as a polishing stop layer in planarizing the dielectric that fills the trenches. After the shallow trench is filled with the dielectric material and planarized, a top portion of the hard mask is removed, resulting in a top portion of the filled dielectric material to protrude above the remaining hard mask. The protruding dielectric is then treated in an oxygen plasma and annealed at a high temperature to form a densified oxide cap layer. The densified oxide layer can provide greater resistance to corrosion and can protect the shallow trench isolation structure during subsequent wet processing, such as DHF clean. Variations in the STI structures can be reduced and device performance improved.

18 Claims, 5 Drawing Sheets

METHOD FOR FORMING SHALLOW TRENCH ISOLATION

CROSS-REFERENCES TO RELATED APPLICATIONS

This application claims priority to Chinese Patent Application No. 201310273050.2, filed Jul. 1, 2013, commonly owned and incorporated herein by reference in its entirety for all purposes.

BACKGROUND OF THE INVENTION

The present invention relates to semiconductor manufacturing processes. In particular, embodiments of the present invention relate to a method for forming shallow trench isolation (STI) structures.

In semiconductor manufacturing processes, shallow trench isolation (STI) structures are critical to the final performance of the electrical properties of semiconductor devices. In forming shallow trench isolation structures, the trenches are often filled with dielectrics, for example, using a high aspect ratio process (HARP). Due to loading effects during in the filling process, the quality of the HARP dielectric may be different in different regions in the semiconductor substrate. As a result, the wet etch rate (WER) of a subsequent wet cleaning process, such as dilute hydrofluoric acid (DHF), may be different, thus resulting in height variations in the shallow trench isolation structures over the semiconductor substrate.

FIG. 1 is a cross-sectional diagram illustrating shallow trench isolation structures formed in a substrate 100 using a conventional method. In FIG. 1, shallow trench isolation structures 101 are formed in a region of dense patterns, and a shallow trench isolation structure 102 is formed in a region of less dense or isolated patterns. It can be seen that the height 103 of shallow trench isolation structures 101 is lower than the height 104 of shallow trench isolation structure 102. One explanation is that the width of STI structures 101 in a dense region is narrower than the width of STI structure 102 formed in a less dense region. As a result, more severe loading effect is shown in the filling of shallow trench isolation structure 101 compared with the shallow trench isolation structure 102. During subsequent wet cleaning processes, the wet etch rate of DHF cleaning solution is higher in shallow trench isolation structure 101 compared with the shallow trench isolation structure 102, leading to variations in the height of STI structures.

Due to the non-uniform height of the shallow trench isolation structures, height variations also exist in subsequently formed gate dielectric material layer and gate electrode material. These variations can lead to different electrical properties in devices formed in different regions of the semiconductor substrate.

Therefore, it is desirable to have an improved method for forming STI structures and resolve the problems described above.

BRIEF SUMMARY OF THE INVENTION

Embodiments of the present invention relate to a method for forming shallow trench isolation (STI) structures. In a specific embodiment, a hard mask, such as silicon nitride, is used in shallow trench etching and also as a polishing stop layer in planarizing the dielectric filling the trenches. After the shallow trench is filled with a dielectric material and planarized, a top portion of the hard mask is removed, resulting in a top portion of the filled dielectric material to protrude above the remaining hard mask. The protruding dielectric is then treated in an oxygen plasma and annealed at a high temperature to form a densified oxide cap layer. The densified oxide layer provides greater resistance to corrosion and can protect the shallow trench isolation structure during subsequent wet processing, such as DHF clean. Variations in the STI structures can be reduced and device performance improved.

According to embodiments of the present invention, a method of forming shallow trench isolation (STI) includes forming a hard mask layer on a semiconductor substrate and patterning the hard mask layer to form openings for a plurality of isolation regions. A plurality of shallow trench isolation structures are formed using the patterned hard mask. In some embodiments, the plurality of shallow trenches are formed using the patterned hard mask, and then a dielectric material, such as a dielectric formed using a HARP process, also referred to as a HARP dielectric, to fill the shallow trenches. Next, a chemical mechanical polishing (CMP) process is used to planarize the filled dielectric using the hard mask layer as a stop layer. The method also includes removing a top portion of said hard mask layer, causing top portions of the plurality of shallow trench isolation structures to protrude above a remaining bottom portion of the hard mask layer. Then, an oxygen plasma treatment is performed to the protruding top portions of the plurality of shallow trench isolation structure, followed by an annealing process to form a densified oxide layer on top surfaces and sidewalls of the protruding portions of the plurality shallow trench isolation structures. Subsequently, the remaining bottom portion of the hard mask layer is removed.

In an embodiment of the above method, the plurality of shallow trench isolation structures are characterized by the same height but may have different widths.

In another embodiment, the hard mask layer is a silicon nitride layer.

In another embodiment, forming the plurality of shallow trench isolation structures includes forming shallow trenches in the semiconductor substrate using the hard mask layer as a mask, forming a layer of insulating material in the shallow trenches and over the patterned hard mark layer, and performing a chemical mechanical polishing (CMP) process to grind the isolation material to expose the hard mask layer. In an embodiment, the insulating material is an oxide. In a specific embodiment, said insulating material comprises an insulating material using a high aspect ratio process (HARP). In an embodiment, the method further comprises, after deposition of the insulating material, implanting a doping element into said insulating material, annealing said insulating material, and forming a second insulating material on said insulating material. In a specific embodiment, the doping element is nitrogen.

In another embodiment, the above method also includes forming a buffer layer between the semiconductor substrate and the hard mask layer to release the stress between the semiconductor substrate and said hard mask layer. In a specific embodiment, the buffer layer includes a thin oxide layer.

In another embodiment of the above method, removing a top portion of said hard mask layer includes using a wet etching process. In an embodiment, the wet etching process is carried out in a hot phosphoric acid etching solution. In another embodiment, after the top portion of the hard mask layer is removed, the thickness of the remaining bottom portion of the hard mask layer is between 200 to 400 Angstroms.

In another embodiment of the above method, the oxygen plasma treatment comprises an oxygen plasma source containing $O_2$ or $O_3$, wherein the oxygen plasma treatment conditions are: a gas flow rate at 1000-5000 sccm, a pressure at 2-10 Torr, a power at 100-1000 W, and a treatment time between 20-120 seconds.

In another embodiment of the above method, the annealing process is carried out in a nitrogen atmosphere at a temperature between 600-1000° C. for a time duration of 30-90 min.

In another embodiment, the method also includes, after removing of the remaining bottom portion of the hard mask layer, another wet cleaning is used to clean the semiconductor substrate and said plurality of shallow trench isolation structures. In a specific embodiment, the wet cleaning fluid is diluted hydrofluoric acid (DHF). In a specific embodiment, the method also includes, after the wet cleaning, forming a gate structure, which is a stacked structure including a gate dielectric layer, a gate electrode material layer, and a gate hard mask layer.

A further understanding of the nature and advantages of the present invention may be realized by reference to the remaining portions of the specification and the drawings.

DETAILED DESCRIPTION OF THE INVENTION

In the following description, numerous specific details are given in order to provide a more thorough understanding of the embodiments of the present invention. However, it is appreciated that one or more details can be omitted. In other examples, some technical characteristics known in the art are not described for simplicity. The preferred embodiment of the present invention is described below in detail, but the present invention can have other embodiments in addition to those described in detail.

It should also be understood that, when used in this specification, the terms "comprises" and/or "includes" indicate the presence of the stated features, steps, operations, elements, and/or components, but do not preclude the presence or addition of one or more other features, steps, operations, elements, components, and/or combinations thereof.

Figure 1:
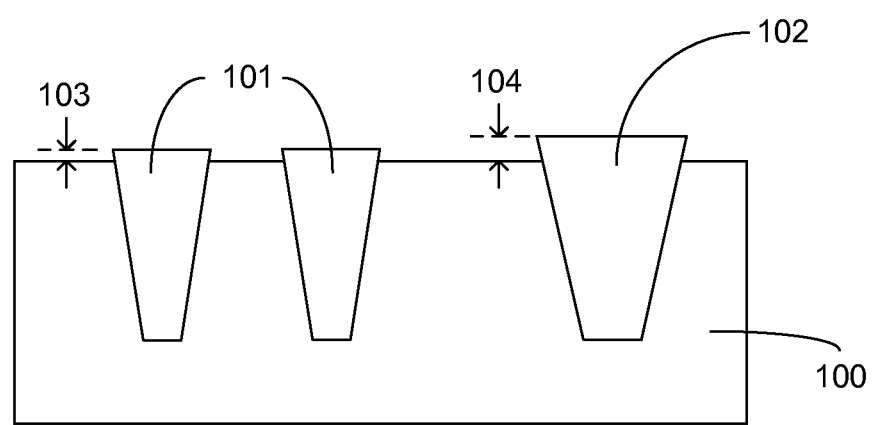
FIG. 1 is a cross-sectional diagram illustrating shallow trench isolation structures formed in a substrate using a conventional method.
Figure 2A:
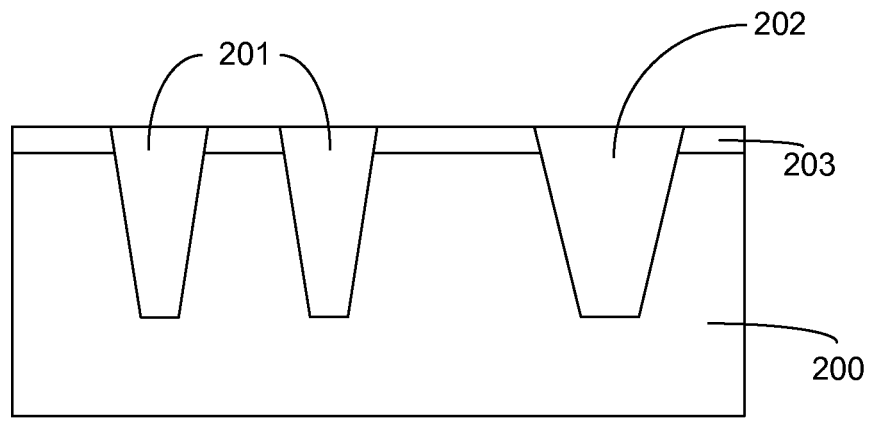
FIGS. 2A-2E are cross-sectional diagram illustrating a method for forming an STI structure according to an exemplary embodiment of the present invention.

FIGS. 2A-2E are cross-sectional diagram illustrating a method for forming an STI structure according to an exemplary embodiment of the present invention. FIG. 2A shows a semiconductor substrate 200, in which shallow trench isolation structures 201 are formed in a high density region and a shallow trench isolation structure 202 is formed in a low density region. Semiconductor substrate 200 may be made of undoped silicon, silicon doped with impurities of silicon, silicon on insulator (SOI), laminated silicon on the insulator silicon (SSOI), laminated silicon-germanium-on-insulator (S—SiGeOI), silicon-germanium-on-insulator (SiGeOI), and germanium on insulator (GeOI), etc. Merely as an example, in the embodiment described below, semiconductor substrate 200 is made of a single crystalline silicon material.

In an embodiment, a hard mask layer 203 is formed on semiconductor substrate 200 using a suitable technology, such as a chemical vapor deposition (CVD) process. In this embodiment, hard mask layer 203 material is silicon nitride deposited on the substrate. Hard mask layer 203 is etched using a patterned photoresist having openings for isolation regions to expose the semiconductor substrate 200 in the isolation regions. Then, the photoresist layer is removed using an ashing process. Next, using the patterned hard mask layer 203 as a mask, semiconductor substrate 200 is etched to form shallow trenches. Then, an insulating material is deposited in the trenches and over the hard mask layer. The insulating material is typically silicon oxides. In this embodiment, the insulating material is deposited using a high aspect ratio process (HARP). Subsequently, a chemical mechanical polishing process (CMP) is used to polish the isolation material to expose the hard mask layer 203, which is used as a polishing stop layer. As shown in FIG. 2A, the intermediate device structure includes planarized shallow trench isolation structures 201 and 202, hard mask layer 203, and substrate 200.

In some embodiments, the insulating material is doped with nitrogen or other elements using an ion implantation process. In an embodiment, the ion implantation dose is between $10^{12}$ to $10^{16}/cm^2$. Then, an annealing process is performed for densification of the insulating material. The annealing temperature may be 800-1050° C. In some embodiments, a second insulating material is deposited on the first insulating material. The second insulating material can be the same as the first insulating material, but can also be a different material. Subsequently, a chemical mechanical polishing (CMP) process is performed to grind the isolation material to expose the hard mask layer 203. Using the methods according to embodiments of the invention, the electrical properties of the shallow trench isolation structure can be improved.

In another embodiments, a thin oxide buffer layer can be formed before the hard mask layer 203 is formed to release the stress between hard mask layer 203 and semiconductor substrate 200. In another embodiment, a thin oxide liner layer cab be formed on the hard mask layer and side walls of the shallow trenches. To simplify the figures, the buffer layer and the liner layer are not shown.

In FIG. 2A, shallow trench isolation structures 201 and 202 are formed simultaneously. Even though shallow trench isolation structures 201 is narrower than shallow trench isolation structure 202, the height of shallow trench isolation structures 201 is the same as the height of the shallow trench isolation structure 202. In some embodiments, semiconductor substrate 200 can also include a variety of well structures, which, in order to simplify the illustration, are omitted. Further, even though FIG. 2A illustrates a semiconductor substrate 200 having two different device regions, it is understood that the semiconductor substrate is not limited to only two regions.

Figure 2B:
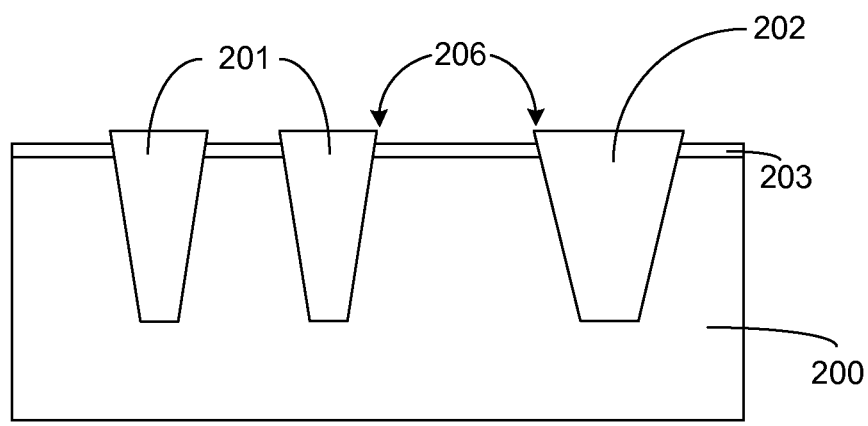

In FIG. 2B, a top portion of hard mask layer 203 is removed. In an embodiment, the remaining bottom portion of hard mask layer 203 has a thickness of 200-400 Å. In an embodiment, a wet etching process is used in the partial removal of hard mask layer 203. The wet etching process can use an etching solution, for example, hot phosphoric acid. As shown in FIG. 2B, removing the top portion of said hard mask layer causes top portions 206 of filling dielectric in the plurality of shallow trench isolation structures to protrude above the remaining bottom portion of the hard mask layer 203.

Figure 2C:
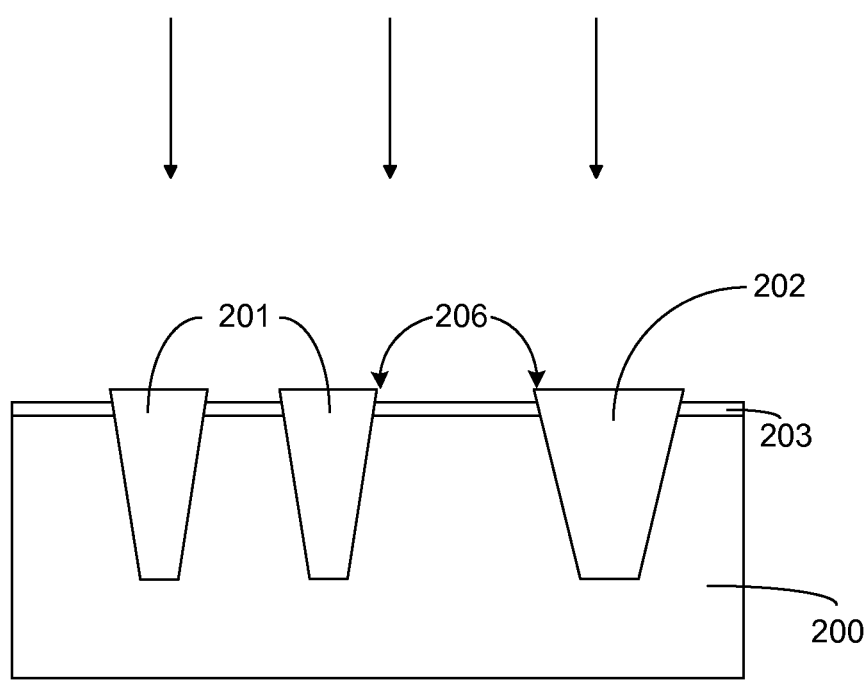

In FIG. 2C, the protruding portions 206 of shallow trench isolation structures 201 and 202 above the hard mask layer 203 is subject to an oxygen plasma treatment. In an embodiment, the oxygen plasma treatment includes oxygen plasma source of $O_2$ or $O_3$. In an embodiment, the process conditions include a gas flow rate of 1000-5000 sccm, a pressure of 2-10 Torr, a power of 100-1000 W, and a treatment time was 20-120 s. Here, Torr represents mm Hg, and sccm represents standard cc/min.

Figure 2D:
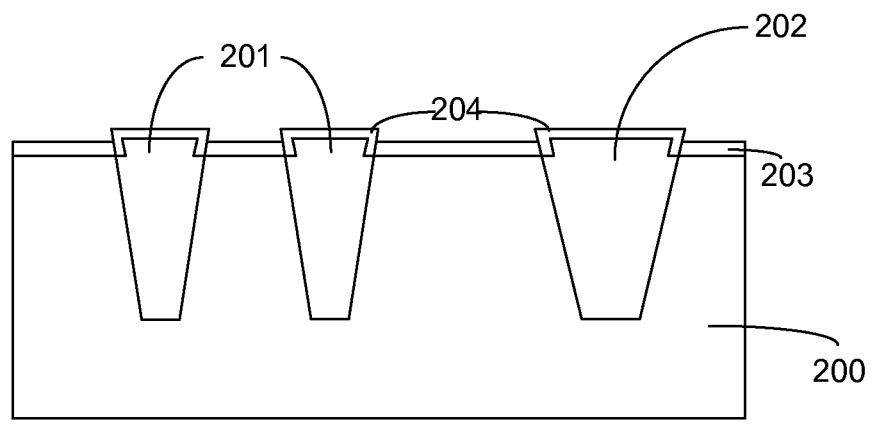

Next, as shown in FIG. 2D, an annealing process is performed to form a densified layer 204 on the top surfaces and sidewalls of the protruding portions 206 of shallow trench isolation structure 201 and 202. In an embodiment, the annealing is carried out in an atmosphere of nitrogen at an annealing temperature in the range of 600-1000° C. for a duration of 30-90 min.

Figure 2E:
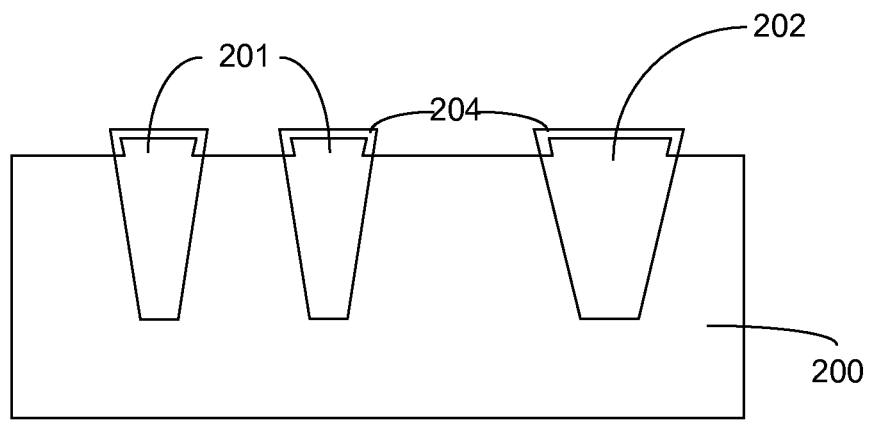

Subsequently, as shown in FIG. 2E, the remaining bottom portion of hard mask layer 203 is removed. In an embodiment, a wet etching process of hot phosphoric acid etching solution is used to remove the hard mask layer. Then, a wet cleaning process, such as diluted hydrofluoric acid clean, is performed to remove residues (e.g., from the etching process) and impurities from semiconductor substrate 200 and the surfaces of shallow trench isolation structure 201 and 202.

Next, a conventional semiconductor device front end manufacturing process can be performed. For example, a gate structure can be formed. The gate structure is a stacked structure including a gate dielectric layer, a gate electrode material layer, and a gate hard mask layer.

In an embodiment, the gate dielectric layer can include oxides such as silicon dioxide ($SiO_2$) formed by rapid thermal oxidation (RTO) to form a gate dielectric layer having a thickness of 8-50 Å. Of course, depending on the application, the gate dielectric not limited to this thickness range.

The a gate electrode material layer may include one or more of silicon, metals, conductive metal nitrides, conductive metal oxide, and a metal silicide. The metal may be tungsten (W), nickel (Ni), or titanium (Ti). The conductive metal nitride can include titanium nitride (TiN). The conductive metal oxide can include iridium oxide ($IrO_2$). An example of metal silicide includes titanium silicide (TiSi). When a polysilicon layer is used as the gate electrode material, a low pressure chemical vapor deposition (LPCVD) process can be used. As an example, the LPCVD process can include the following conditions: a reaction gas of silane (SiH4), a flow rate of 100~200 sccm, preferably 150 sccm, in a reaction chamber at a temperature of 700~750° C., at a reaction chamber pressure of 250~350 mTorr, preferably 300 mTorr. The reaction gas may further include a buffer gas, such as helium (He) or nitrogen (N2), at a flow rate of 5 to 20 liters/minute (slm), preferably 8 slm, 10 slm or 15 slm.

The gate hard mask material layer may include one or more of oxides, nitrided oxides, and amorphous carbon. For example, the oxide can include boron phosphosilicate glass (BPSG), phosphosilicate glass (PSG), tetraethyl orthosilicate (TEOS), undoped silicate glass (USG), spin-on glass (SOG), high density plasma (HDP), or spin coating, dielectric (SOD). The nitride can include silicon nitride (SiN). The nitrogen oxides can include silicon oxynitride (SiON). The gate hard mask layer can be formed using a known chemical vapor deposition (CVD) process, such as low temperature chemical vapor deposition (LTCVD), low pressure chemical vapor deposition (LPCVD), rapid thermal chemical vapor deposition (RTCVD), or plasma enhanced chemical vapor deposition (PECVD).

Next, sidewall structures can be formed on the sidewalls of patterned gate electrodes. The sidewall spacers can be formed in materials such as $SiO_2$, SiN, SiON, or a combination thereof. Then, using the side wall structures as a mask, an LDD (lightly doped drain) implantation process is carried out. Next, offset sidewall spacers are formed on both sides of the gate electrode. As an example, the offset spacers can include at least one oxide layer and/or a nitride layer. Then, using the offset spacers as a mask, source/drain implantation is performed to form source and drain regions on both sides of the offset spacers.

In some embodiments, a salicide (self-aligned silicide) process is used to form self-aligned silicide on top of the gate structure and on the source/drain regions. Then, a contact etch stop layer and an interlayer dielectric layer are formed on semiconductor substrate 200. Self-aligned contact holes are formed in the interlayer dielectric layer on source/drain regions on both sides of the gate structure. The contact holes are filled with a metal (usually tungsten) connecting a metal interconnection layer and the self-aligned silicide contact holes.

Next, a conventional semiconductor device backend process can be implemented, which can include a plurality of interconnected metal layers, often formed using a dual damascene process. Further, metal pads are formed for wire bonding in a device package.

Figure 3:
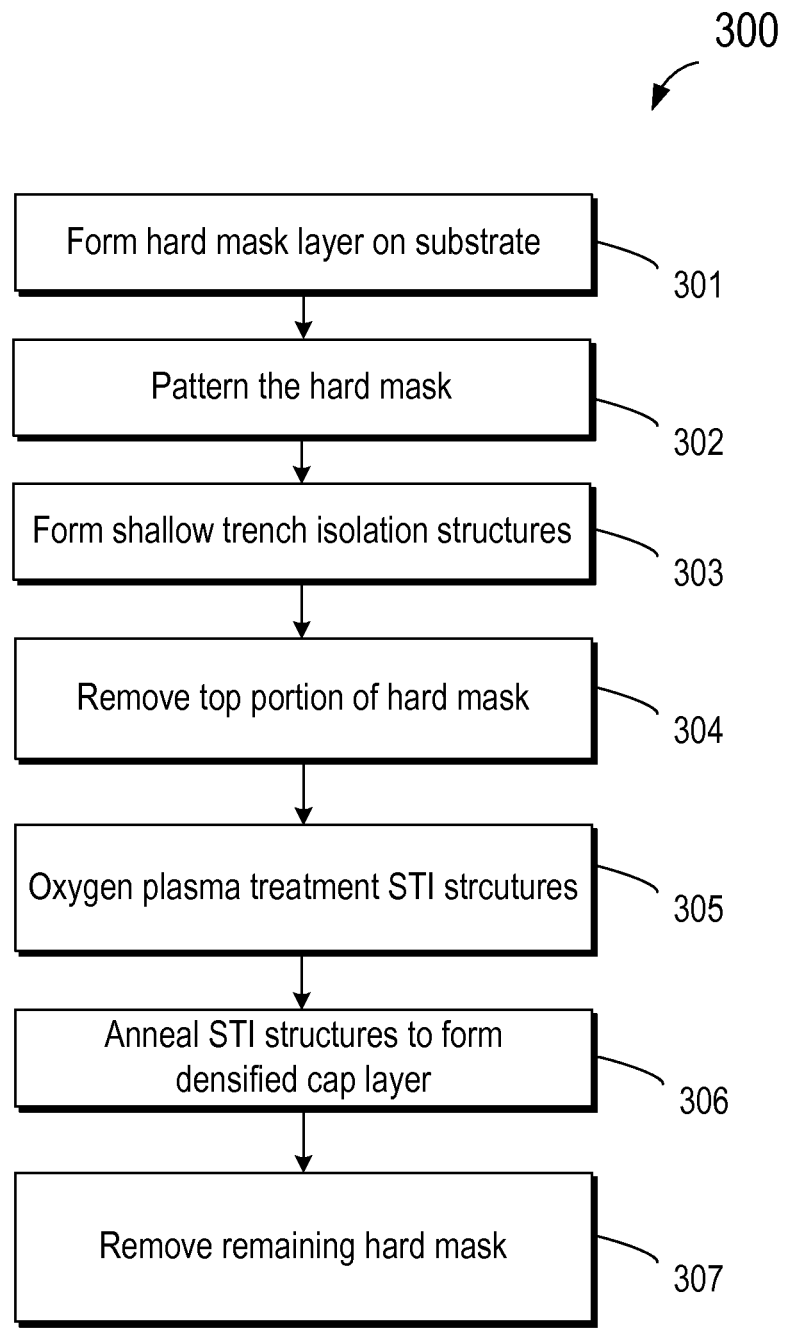
FIG. 3 is a flow chart illustrating a method for forming an STI structure according to an exemplary embodiment of the present invention.

FIG. 3 is a flow chart illustrating a method 300 of forming shallow trench isolation (STI). The method includes the following steps.

Step 301—forming a hard mask layer on a semiconductor substrate;

Step 302—patterning the hard mask layer to form openings for a plurality of isolation regions;

Step 303—forming a plurality of shallow trench isolation structures in the semiconductor substrate using;

Step 304—removing a top portion of said hard mask layer, causing top portions of the plurality of shallow trench isolation structures to protrude above a remaining bottom portion of the hard mask layer;

Step 305—performing oxygen plasma treatment to the protruding top portions of the plurality of shallow trench isolation structure;

Step 306—performing an annealing process to form a densified oxide layer on top surfaces and sidewalls of the protruding portions of the plurality shallow trench isolation structure; and Step 307—removing the remaining bottom portion of the hard mask layer.

According to the present invention, a densified oxide layer 204 is formed in a top portion and side walls of the shallow trench isolation structures 201 and 202 protruding above semiconductor substrate 200. This densified layer provides stronger corrosion resistance in the shallow trench isolation structures 201 and 202 then conventional STI structures. As described above, in conventional methods, the difference in quality characteristics in the isolating material of STI structures in different regions can result in different heights of shallow trench isolation structure when exposed to wet DFH cleaning process. In embodiments of the present invention, the stronger corrosion resistance of the densified layer is useful in protecting the shallow trench isolation structures during the wet cleaning DHF process. Thus, the variation in the height of shallow trench isolation structures suffered by conventional methods can be avoided.

The present invention has been described by specific embodiments. However, it should be understood that the above embodiments are merely examples for of illustration purposes. They are not intended to limit the scope of the invention. In addition, it is understood that, according to the teachings of the present invention, variations and modifications can be made thereof, which will be within the spirit and purview of the present invention.

What is claimed is:

1. A method of forming shallow trench isolation (STI), comprising:

forming a hard mask layer on a semiconductor substrate;

patterning the hard mask layer to form openings for a plurality of isolation regions;

forming a plurality of shallow trench isolation structures in the semiconductor substrate;

removing a top portion of said hard mask layer, causing top portions of the plurality of shallow trench isolation structures to protrude above a remaining bottom portion of the hard mask layer;

performing oxygen plasma treatment to the protruding top portions of the plurality of shallow trench isolation structure;

performing an annealing process to form a densified oxide layer on top surfaces and sidewalls of the protruding portions of the plurality of shallow trench isolation structures; and removing the remaining bottom portion of the hard mask layer after the annealing process has been performed.

2. The method of claim 1, wherein said plurality of shallow trench isolation structures are characterized by the same height but different widths.

3. The method of claim 1, wherein said hard mask layer is a silicon nitride layer.

4. The method of claim 1, wherein, after the top portion of said hard mask layer is removed, the thickness of the remaining bottom portion of the hard mask layer is between 200 to 400 Angstroms.

5. The method of claim 1, wherein said oxygen plasma treatment comprises an oxygen plasma source containing $O_2$ or $O_3$, wherein the oxygen plasma treatment conditions are: gas flow rate at 1000-5000 sccm, pressure at 2-10 Torr, power at 100-1000 W, and treatment time between 20-120 seconds.

6. The method of claim 1, wherein the annealing process is carried out in a nitrogen atmosphere at a temperature between 600-1000° C. for a time duration of 30-90 min.

7. The method of claim 1, wherein forming the plurality of shallow trench isolation structures comprises:

forming shallow trenches in the semiconductor substrate using the hard mask layer as a mask;

forming a layer of insulating material in the shallow trenches and over the patterned hard mark layer; and performing a chemical mechanical polishing (CMP) process to grind the insulating material to expose the hard mask layer.

8. The method of claim 7, wherein said insulating material is an oxide.

9. The method of claim 8, wherein said insulating material comprises an insulating material using a high aspect ratio process (HARP).

10. The method of claim 7, further comprising, after deposition of the insulating material:

implanting a doping element into said insulating material;

annealing said insulating material; and forming a second insulating material on said insulating material.

11. The method of claim 10, wherein the doping element is nitrogen.

12. The method of claim 1, further comprising forming a buffer layer between the semiconductor substrate and said hard mask layer to release stress between the semiconductor substrate and said hard mask layer.

13. The method of claim 12, wherein said buffer layer comprises a thin oxide layer.

14. The method of claim 1, wherein removing a top portion of said hard mask layer comprises a wet etching process.

15. The method of claim 14, wherein said wet etching process is carried out in a hot phosphoric acid etching solution.

16. The method of claim 1, further comprising, after removing of the remaining bottom portion of the hard mask layer, wet cleaning the semiconductor substrate and said plurality of shallow trench isolation structures.

17. The method of claim 16, wherein said wet cleaning the cleaning fluid is diluted hydrofluoric acid (DHF).

18. The method of claim 16, further comprising, after the wet cleaning, forming a gate structure, said gate structure being a stacked structure including a gate dielectric layer.

* * * * *